United States Patent [19]

Golda et al.

[11] 4,086,092

[45] Apr. 25, 1978

[54] PROCESS FOR MAKING PHOTOSENSITIVE LITHOGRAPHIC PRINTING PLATES INVOLVING SEQUENTIALLY COATING WITH POTASSIUM ZIRCONIUM FLUORIDE AND SODIUM SILICATE

[75] Inventors: Eugene Golda, Monsey; Alan Leonard Wilkes, Brewster, both of N.Y.

[73] Assignee: Polychrome Corporation, Yonkers, N.Y.

[21] Appl. No.: 788,216

[22] Filed: Apr. 18, 1977

[51] Int. Cl.$^2$ .............................................. G03C 1/94
[52] U.S. Cl. ..................................... 96/86 R; 96/33; 427/419; 148/6; 148/6.27
[58] Field of Search ........................ 96/86 R, 36.3, 33; 106/287 S, 74; 148/6, 6.27; 101/459; 204/35 N, 38 A; 427/419

[56] References Cited

U.S. PATENT DOCUMENTS

| 2,882,153 | 4/1959 | Cohn | 96/86 R |
| 3,148,984 | 9/1964 | Harper | 96/75 |
| 3,682,713 | 8/1972 | Ries et al. | 148/6.2 |
| 3,912,548 | 10/1975 | Faigen | 427/419 |

Primary Examiner—John D. Welsh

[57] ABSTRACT

A method for preparing aluminum based lithographic printing plates which comprises coating at least one surface of an aluminum base sheet with a potassium zirconium fluoride solution, thereafter treating the coated, aluminum plate with a stratum of a sodium silicate solution and then applying to said surface a lithographically suitable light sensitive composition to yield the desired photosensitive lithographic printing plate of improved characteristics.

9 Claims, No Drawings

PROCESS FOR MAKING PHOTOSENSITIVE LITHOGRAPHIC PRINTING PLATES INVOLVING SEQUENTIALLY COATING WITH POTASSIUM ZIRCONIUM FLUORIDE AND SODIUM SILICATE

BACKGROUND OF THE INVENTION

This invention relates to a novel method for the production of presensitized lithograhic printing plates and to the novel lithographic printing plates produced thereby. More particularly, this invention relates to a novel method of producing aluminum based photosensitive lithographic printing plates which comprises coating at least one surface of an aluminum base sheet with a potassium zirconium fluoride solution, thereafter treating the coated aluminum sheet with a stratum of a sodium silicate solution and finally applying to said treated surface a lithographically suitable light sensitive coating to yield the desired photosensitive lithographic printing plate.

It is well recognized that the substantial majority of photosensitive lithographic printing plates now produced are made from an aluminum based sheeting. This aluminum sheeting has, over the years, been found to suffer from certain disadvantages which prevent the direct application of the light sensitive coating to the aluminum base sheet. It has been found that upon direct application of the light sensitive composition to the aluminum base sheet, and subsequent exposure thereof to light, and the removal of the non-imaged areas for the preparation of a lithographic printing plate, the resultant printing plate has many undesirable characteristics which render it unacceptable for commercial use in the printing industry. Among the disadvantages suffered by such plates can be included the fact that the removed non-image areas do not possess sufficient hydrophilic and oleophobic characteristics, and therefore on printing will pick up background imperfections which will be imprinted on the final copy. In addition, since the aluminum is a rather soft metal, it does not have the resistance properties to sustain long press runs where more than about 100,000 copies are required. Further, the characteristic of the aluminum surface is such that a problem is encountered in achieving a strong bond between the light sensitive composition and the aluminum base sheet thus causing the image area of the plate to be dislodged from the surface, and renders the printed copy imperfect.

Heretofore, in the production of metal presensitized lithographic printing plates, it had been found beneficial to treat the surface of the metal substrate sheet, with a protective interlayer substance which imparts beneficial characteristics to the final lithographic printing plate thus produced. The prior art teaches that it is desirable to treat the metal sheet substrate surface receiving the light sensitive coating material, which when exposed to light and developed becomes the printing surface of the printing plate, with an undercoating substance that forms a strong bond with the metal sheet substrate and with the light sensitive coating material.

Many such undercoating treatments are known in the art for manufacturing longer running lithographic plates, and can be used on the sheets of this invention. U.S. Pat. Nos. 3,160,506, 3,136,636, 2,946,683, 2,922,715, disclose a variety of suitable materials for undercoating bonding substances onto plates and methods for applying them.

One method in particular which is disclosed in the Jewett et al., U.S. Pat. No. 2,714,066 issued July 26, 1955, involves the use of a silicious overcoating on the aluminum sheet surface which acts as an interlayer bonding the photosensitive composition to the aluminum sheet surface. However, it has been found that this method does not completely solve the problem of bonding strength in that the bonding between the photosensitive composition and the aluminum base sheet has been found not to be strong enough to withstand long press runs, and in addition, tends to wear out or fail over an extended period of time.

The instant invention provides a novel method of manufacturing presensitized lithographic plates wherein a potassium zirconium fluoride solution is coated directly to the surface of an aluminum sheet substrate, which may have previously been grained, anodized or etched. The coated substrate is subsequently treated with a sodium silicate solution and then coated with a suitable lithographic photosensitive composition which is well known in the art.

The resulting lithographic plate demonstrates a substantially extended shelf life, a protracted press life and improved clarity of the resultant printed image with improved oleophobic characteristics revealed in the non-image plate areas.

PRIOR ART

As previously mentioned, a number of interlayer pretreatments are known in the art but these differ materially from the present invention.

U.S. Pat. No. 3,160,506 issued to O'Conner and Chu discloses a method for preparing planographic printing plates employing a wide choice of interlayer compositions, however, these are single interlayer applications and it does not teach the use of the dual interlayer combination as revealed in the present invention.

U.S. Pat. No. 3,181,461 issued to Fromson teaches applying a silicate coating on aluminum sheet having an aluminum oxide coating thereon.

British Pat. No. 884,110 issued to Polychrome Corporation discloses the treatment of a grained and/or etched aluminum surface with a zirconium hexahalide interlayer but does not provide for the dual interlayer combination of the instant invention.

British Pat. No. 1,031,263 issued to Polychrome Corporation teaches sealing the surface of a metal plate with a hydrophilic fluoride — chromic acid composition, but again, not the dual interlayer combination of the present invention.

As part of the present invention, we have unexpectedly found that a significantly improved lithographic printing plate may be produced by first applying a potassium zirconium fluoride solution to an aluminum surface, which may have been previously grained, anodized, etched or cleaned, and subsequently applying a solution of sodium silicate to the treated aluminum surface. Thereafter a lithographically suitable photosensitive coating may be applied to the layered aluminum surface in a manner well known to the skilled worker.

A lithographic plate produced with such a coated, aluminum substrate demonstrates improved shelf life, resistance to oxidation, and improved hydrophilic characteristics in the non-image areas when the plate is developed and employed on an offset printing press.

Although many other prior art disclosures do not show the inclusion of an interlayer, plates manufactured according to these specifications demonstrate an inadequate adhesion of the photosensitive material to the base substrate and are unsatisfactory for long press runs. The desirability of such an interlayer for improved bonding and protection of the base is well known to the art.

The present invention substantialy improves the bonding and protecting performance of these interlayers resulting in a concurrent increase in plate press life with a significant increase in the oleophobic propensities of the non-image plate areas.

SUMMARY OF THE INVENTION

The present invention provides a method of preparing an improved lithographic plate whereby a metal sheet substrate, preferably aluminum and the alloys thereof, which may have been grained, anodized and/or etched is first coated with an interlayer composed of an aqueous potassium zirconium fluoride solution. The thus coated substrate is subsequently treated with a layer of an aqueous sodium silicate solution. The thus treated substrate may then be coated with a lithographically suitable photosensitive composition as hereinbefore mentioned.

It is therefore an object of the present invention to provide an improved method for treating a metal sheet substrate suitable for use as a base for a lithographic plate whereby said substrate is coated with a potassium zirconium fluoride solution and subsequently treated with a sodium silicate solution prior to the application of a lithographically suitable photosensitive composition.

It is a further object of the present invention to provide an improved method for treating a metal sheet substrate suitable for use as a base for a lithographic plate whereby the resultant lithographic plate manifests an increased shelf life and a prolonged press life.

It is another object of the present invention to provide a novel lithographic plate having improved image clarity.

It is still another object of the present invention to provide an improved lithographic printing plate which exhibits added bonding and protection between the metal sheet substrate and the photosensitive coating.

It is a still further object of the present invention to provide a lithographic printing plate which has added oleophobic properties in the non-image plate areas, thus providing a cleaner running plate over its lifetime.

These and other objects of this invention will be in part discussed and in part apparent upon examination of the detailed description of the preferred embodiment.

DETAILED DESCRIPTION OF THE PREFERRED EMBODIMENT

As the first step in the process of this invention, a sheet metal substrate, preferably aluminum and the alloys thereof especially those aluminum compositions suitable for the manufacture of lithographic printing plates such as Alcoa 3003 and Alcoa 1100, which may or may not have been pretreated by standard cleaning, graining, anodizing and/or etching techniques as are well known in the art, is coated by spraying, brushing, dipping or other means with an aqueous potassium zirconium fluoride solution.

It has been found within the context of the present invention that the concentration of the potassium zirconium fluoride solution may be from about 0.1% to about 5.0% by weight with a preferred range of from about 0.5% to about 2.0% and a most preferred range of from about 0.8% to about 1.5%. The temperature of the solution may vary from about 70° to about 210° F. with a preferred range of from about 100° to about 190° F. and a most preferred range of from about 160° to about 170° F. Also, the dip time of the substrate within the coating bath may be from about 10 seconds to about 5 minutes with a preferred time of from about 30 seconds to about 2 minutes and a most preferred time of from about 45 seconds to about 1.5 minutes.

The coated substrate is then treated with an aqueous solution of sodium silicate. It has been found within the context of the present invention that the concentration of the sodium silicate solution may be from about 0.1% to about 10.0%, by weight with a preferred range of from about 2.0% to about 8.0% and a most preferred range of from about 3.0% to about 6.0%. The temperature of the solution may vary from about 70° to about 210° F. with a preferred range of from about 100° to about 190° F. and a most preferred range of from about 150° to about 160° F. Also, the dip time of the substrate within the coating bath may be from about 10 seconds to about 5 minutes with a preferred time of from about 30 seconds to about 2 minutes and a most preferred time of from about 45 seconds to about 1.5 minutes.

It is understood that the foregoing parameters are necessarily interdependent and various combinations and modifications of said parameters are operable in the context of the present invention. The hereinbefore mentioned parameters are specifically not intended to limit the scope of the instant invention.

The resulting metal sheet substrate may then be coated with a photosensitive composition suitable for lithographic purposes. The photosensitive compositions which may be satisfactorily employed in the practice of this invention are those which are lithographically suitable and are actinic and ultraviolet light reactive. The photosensitive compositions which may be employed in the practice of this invention are those which are negative or positive acting and include such negative acting photosensitive agents as, the azidopyrenes, for example, 1-azidopyrene, 6-nitro-1-azidopyrene, 1,6-diazidopyrene, 1,8-diazidopyrene, 1-propionyl-6-azidopyrene, 1-acetyl-6-azidopyrene, 1-n-butyryl-6-azidopyrene, 1-n-propionyl-8-bromo-6-azidopyrene, 6-n-propionyl-1-azidopyrene-8-sulfonic acid and 8-n-propionyl-1,6-diazidopyrene; and such positive acting photosensitive agents as aromatic diazo-oxide compounds, for example, benzoquinone diazides, naphthoquinone diazides, and polyacetals which depolymerize under ultraviolet radiation, polymonochloroacetaldehyde, polypropionaldehyde, poly-n-butyraldehyde, polycyanoacetaldehyde, poly-B-cyanopropionaldehyde, polyisobutyraldehye, poly-valeraldehyde, poly-heptaldehyde. The most satisfactory photosensitive agent may be selected by the skilled worker, depending upon the results sought to be achieved.

The optimum proportion of each ingredient and selection of particular composition naturally depends on the specific properties desired in the final lithographic plate. It has been found that lithographic plates made in accordance with the present invention display a significant increase in both printing press and shelf storage life.

The thus produced lithographic plate, when exposed and developed, demonstrates improved image stability, an increase in the hydrophilic propensities of the non-image areas, and thus is a much cleaner running plate over its useful lifetime.

The following examples are provided to illustrate the operation of the present invention and in no way limits its scope.

EXAMPLE 1

Three sheets of Alcoa grade 3003 aluminum were degreased and chemically etched for 30 seconds in a 10% potassium hydroxide solution at 140° F, and subsequently desmutted with a 5% nitric acid solution for 30 seconds at 100° F. Sample A was then treated in a 1% potassium zirconium fluoride bath at 170° F for 30 seconds and rinsed with water. Sample B was then treated in a 5% sodium silicate solution bath for 30 seconds at 170° F and rinsed with water. Sample C was then treated in a 1% potassium zirconium fluoride bath at 170° F for 30 seconds, rinsed in water, and then treated in a 5% sodium silicate solution for 30 seconds at 170° F and rinsed with water. The samples A, B, C, were then coated with a light sensitive lithographic coating.

Each sample was exposed to accelerated shelf life testing which showed plates made according to treatment C of the instant invention to have consistently good image producing quality after a simulated 2 year shelf life. Whereas, plates made according to samples A and B were found to give inconsistent image producing qualities after one and one half year's accelerated shelf life.

Plates A, B, C, were exposed and developed according to standard methods and mounted on a printing press. Plate A showed first appearance of image wear after 25,000 impressions; Plate B showed image weakness after 1,000 impressions; Plate C showed first image wear after 40,000 impressions. Hence the plates produced according to the instant invention demonstrate superior shelf life and printing press life.

EXAMPLE 2

A sheet of Alcoa grade 1100 aluminum was grained with a pumice slurry and rinsed with water. This was then sectioned into 3 samples. Sample A was then treated for 60 seconds in a 1% potassium zirconium fluoride solution at 170° F and rinsed in water. Sample B was then treated for 60 seconds in a 5% sodium silicate solution at 170° F and rinsed in water. Sample C was treated for 60 seconds in a 1% potassium zirconium fluoride solution at 170° F, rinsed in water and subsequently treated in a 5% sodium silicate solution for 60 seconds at 170° F and rinsed in water. The samples A, B, C were then coated with a light sensitive lithographic coating.

Each sample was exposed to accelerated shelf life testing which showed plates made according to treatment C to have consistently good image producing quality after one and one half years simulated shelf life. Whereas, plates made according to sample A were found to give inconsistent image producing qualities after six months and sample B was found to give inconsistent image producing qualities after one year simulated shelf life.

Plates A, B, C were exposed and developed according to standard methods and mounted on a printing press. Plate A showed first appearance image wear after 50,000 impressions. Plate B showed first appearance of wear after 45,000 impressions. Plate C showed first appearance of wear after 75,000 impressions. Again, Plate C produced according to the method of the instant invention displayed superior shelf life and press life qualities.

EXAMPLE 3

A sheet of Alcoa grade 1100 aluminum was grained with a pumice slurry and rinsed with water. Subsequently, it was treated in a 15% $H_2SO_4$ solution at 80° F with D. C. current of 16 amp/ft$^2$ and rinsed with water. The above treated aluminum was sectioned into 3 samples.

Sample A was then treated with a 0.5% potassium zirconium fluoride solution for 45 seconds at 180° F and rinsed in water. Sample B was then treated with a 4% sodium silicate solution for 45 seconds at 180° F and rinsed in water. Sample C was then treated with a 0.5% potassium zirconium fluoride solution for 45 seconds at 180° F rinsed with water and subsequently treated with a 4% sodium silicate solution for 45 seconds at 180° F and rinsed in water. The samples A, B, C, were then coated with a light sensitive lithographic coating.

Each sample was exposed to accelerated shelf life testing which showed plates made according to Sample C to have consistently good image producing quality after two years simulated shelf life testing.

Samples made according to treatment A were found to have inconsistent image producing quality after one year simulated shelf life testing and samples made according to treatment B were found to have inconsistent image producing quality after one and one half years simulated shelf life testing.

Samples A, B, C, were exposed and developed according to standard methods and mounted on a printing press. Plate A showed first appearance of image wear after 100,000 impressions. Plate B showed first appearance of wear after 110,000 impressions. Plate C showed first appearance of wear after 140,000 impressions. Therefore, plates made according to the procedure of the present invention again demonstrate the beneficial qualities of extended storage life and press wear life.

Importantly, it must be understood that this series application of interlayers is by no means an obvious combination. We have unexpectedly found that the sequence of application is critical in that superior results are obtained when the potassium zirconium fluoride is first applied to the substrate and the sodium silicate is subsequently applied. The reverse sequence of application, that is, first applying the sodium silicate and then applying the potassium zirconium fluoride demonstrates poorer results as the following example illustrates.

EXAMPLE 4

A sheet of Alcoa grade 3003 aluminum was degreased and chemically etched for 45 seconds in a 15% potassium hydroxide solution at 150° F, rinsed with water, and subsequently desmutted with a 3% sodium sulfite type deoxidizing compound for 60 seconds at 100° F. This was then sectioned into two samples. Sample A was further treated in a 1% potassium zirconium fluoride solution for 60 seconds at 170° F, rinsed with water and then treated in a 5% sodium silicate solution for 60 seconds at 170° F and rinsed with water. Sample B was treated in a 5% sodium silicate solution for 60 seconds at 170° F, rinsed with water and then treated in a 1% potassium zirconium fluoride solution for 60 seconds at 170° F and rinsed with water. Samples A and B were then coated with a light sensitive lithographic coating.

Each sample was exposed to accelerated shelf life testing which showed plates made according to treatment A to have consistently good image producing quality after a simulated 2 year shelf life. Whereas, plates made according to Sample B were found to give inconsistent image producing qualities after a simulated one and three quarter years shelf life.

Plates A and B were imaged and developed according to standard methods and mounted on a printing press. Plate B showed first appearance of wear after 22,000 impressions. Whereas, Plate A showed first appearance of wear after 35,000 impressions. Hence the sequence of coating application is critical, with superior results produced by the method of the present invention.

It has also been found that a mixture of the solutions does not produce an acceptable interlayer as shown by the following example.

EXAMPLE 5

A sheet of Alcoa grade 3003 aluminum was degreased and chemically etched for 30 seconds in a 10% potassium hydroxide solution at 150° F, rinsed with water, and subsequently desmutted with a 6% Hubbard-Hall Deoxidizer No. 13 solution, which is a non-chromated, non-phosphated dry acid salt, for 60 seconds at 90° F and rinsed with water.

A composition was prepared by adding a 3% sodium silicate solution to a 1% potassium zirconium fluoride solution. Upon addition of the sodium silicate a pH neutralization occurred, as potassium zirconium fluoride is acidic, while sodium silicate is alkaline. This resulted in the formation of a double precipitate in the solution.

The aluminum sample was then treated in this above described solution for 60 seconds at 170° F and rinsed with water. Subsequently the sample was coated with a light sensitive lithographic coating.

The plate was exposed and developed according to standard methods and mounted on a printing press. The image peeled off within 100 impressions indicating a lack of interlayer formation on the aluminum substrate. Therefore, the beneficial qualities of a combination of these compositions would not be apparent to the skilled artisan.

It is, of course, to be understood that the foregoing disclosure is intended to illustrate the invention and that numerous changes can be made in the conditions and proportions set forth without departing from the scope of the invention as disclosed and defined in the claims appended hereafter.

We claim:

1. A method for preparing lithographic printing plates which comprises first coating at least one surface of a metal sheet substrate with an aqueous solution of potassium zirconium fluoride, subsequently treating the coated substrate with an aqueous solution of sodium silicate and then applying to the thus treated substrate a lithographically suitable photosensitive composition.

2. The lithographic printing plate obtained by the method of claim 1.

3. The method of claim 1 wherein the metal sheet substrate is comprised of aluminum.

4. The method of claim 3 wherein the aluminum substrate has been grained.

5. The method of claim 3 wherein the aluminum substrate has been anodized.

6. The method of claim 4 wherein the aluminum substrate has been anodized.

7. The method of claim 1 wherein the photosensitive composition contains a photosensitizing agent selected from the group consisting of aromatic diazo compounds, azidopyrenes, benzoquinone diazides, naphthoquinone diazides, polyacetals which depolymerize under ultraviolet radiation, polymonochloroacetaldehyde, polypropionaldehyde, poly-n-butyraldehyde, poly-cyano-acetaldehyde, poly-B-cyanopripionaldehyde, poly-cyano-pentaldehyde, polycycnovaleraldehyde, poly-n-butyraldehyde, poly-isobutyraldehyde, polyvaleraldehyde and polyheptaldehyde.

8. The method of claim 1 wherin said metal sheet substrate is coated with an aqueous potassium zirconium fluoride solution having a concentration of from about 0.1% to about 5.0% by weight, maintained at a temperature of from about 70° to about 210° F for from about 10 seconds to about 5 minutes.

9. The method of claim 1 wherein said coated substrate is treated with an aqueous sodium silicate solution having a concentration of from about 0.1% to about 10.0% by weight, maintained at a temperature of from about 70° to about 210° F for from about 10 seconds to about 5 minutes.

* * * * *